United States Patent [19]
Burton et al.

[11] Patent Number: 4,590,456
[45] Date of Patent: May 20, 1986

[54] LOW LEAKAGE CMOS D/A CONVERTER

[75] Inventors: David P. Burton; Peter Real, both of Limerick, Ireland

[73] Assignee: Analog Devices, Incorporated, Norwood, Mass.

[21] Appl. No.: 762,967

[22] Filed: Aug. 6, 1985

Related U.S. Application Data

[63] Continuation of Ser. No. 684,453, Dec. 21, 1984, abandoned, which is a continuation of Ser. No. 414,317, Sep. 2, 1982, abandoned.

[51] Int. Cl.$^4$ ............................................ H03K 17/687
[52] U.S. Cl. ........................ 340/347 DA; 340/347 CC; 307/585
[58] Field of Search ................ 340/347 CC, 347 DA; 307/469, 576, 579, 585

[56] References Cited
U.S. PATENT DOCUMENTS
3,984,830 10/1976 Buchanan et al. .
4,446,390 5/1984 Alaspa .

OTHER PUBLICATIONS
Cecil "1974 IEEE International Solid-State Circuits Conference Digest of Technical Papers", pp. 196–197, Feb. 1974.
Milnes, "Semiconductor Devices and Electronics", Van Nostrand Reinhold Co., 1980, pp. 398–399.

*Primary Examiner*—Charles D. Miller
*Attorney, Agent, or Firm*—Parmelee, Bollinger & Bramblett

[57] ABSTRACT

A CMOS DAC with means to avoid leakage current. In one embodiment, the back gates of the CMOS switches are held at −200 mV with respect to the output lines, and the logic low level to the off switch also is set at −200 mV relative to the output lines. In another embodiment, the CMOS switches are ion-implanted. In a still further embodiment, the output lines are held at a potential 200 mV more positive than the P- well of the CMOS switches.

15 Claims, 10 Drawing Figures

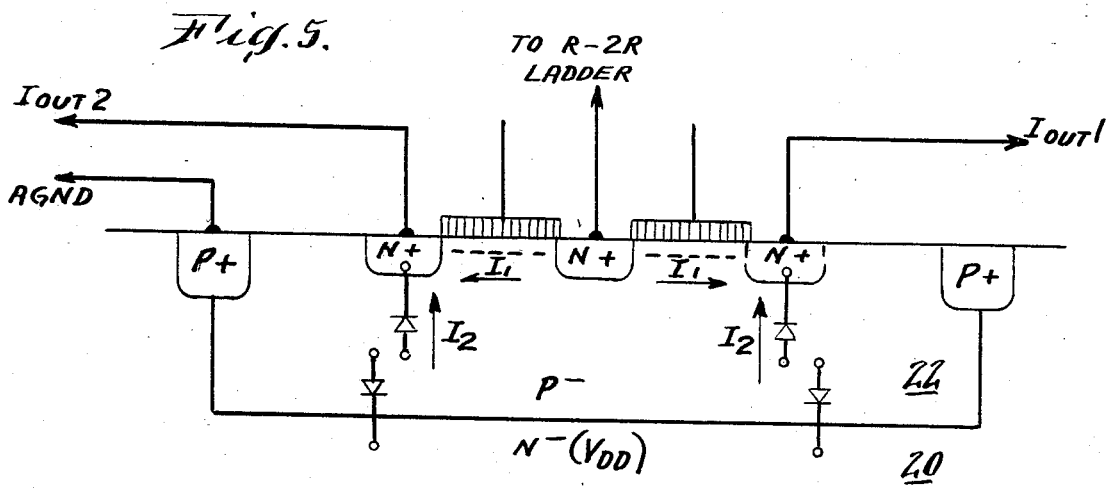
Fig. 5.
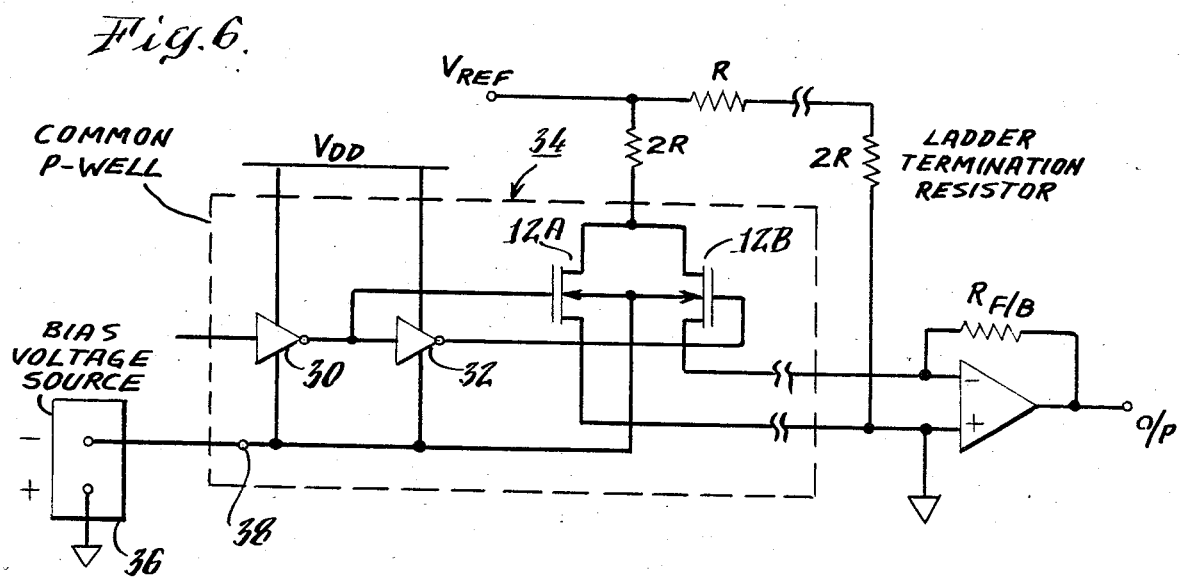
Fig. 6.
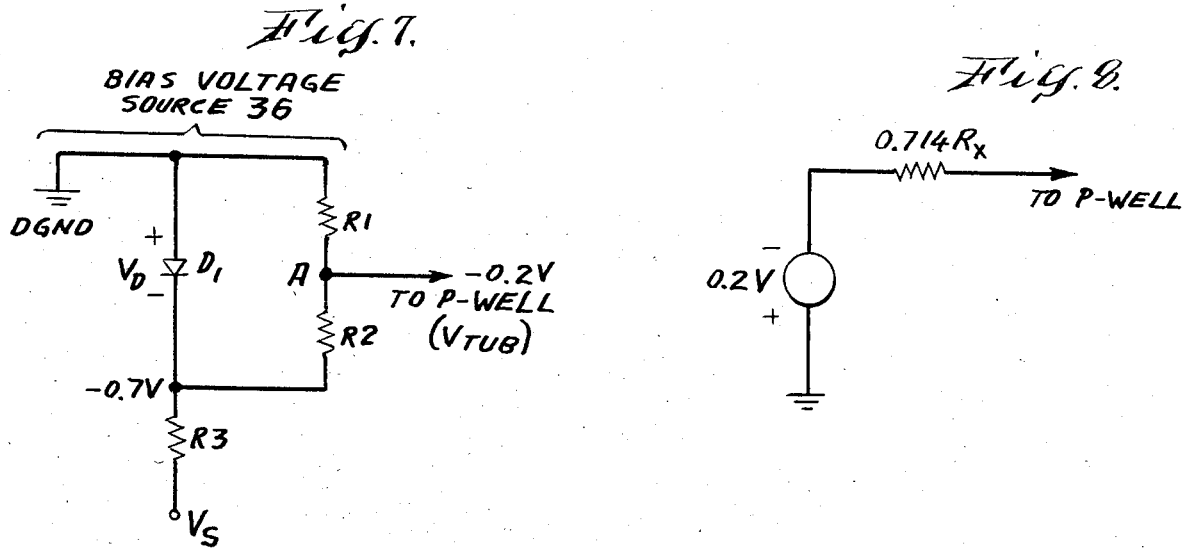
Fig. 7.
Fig. 8.

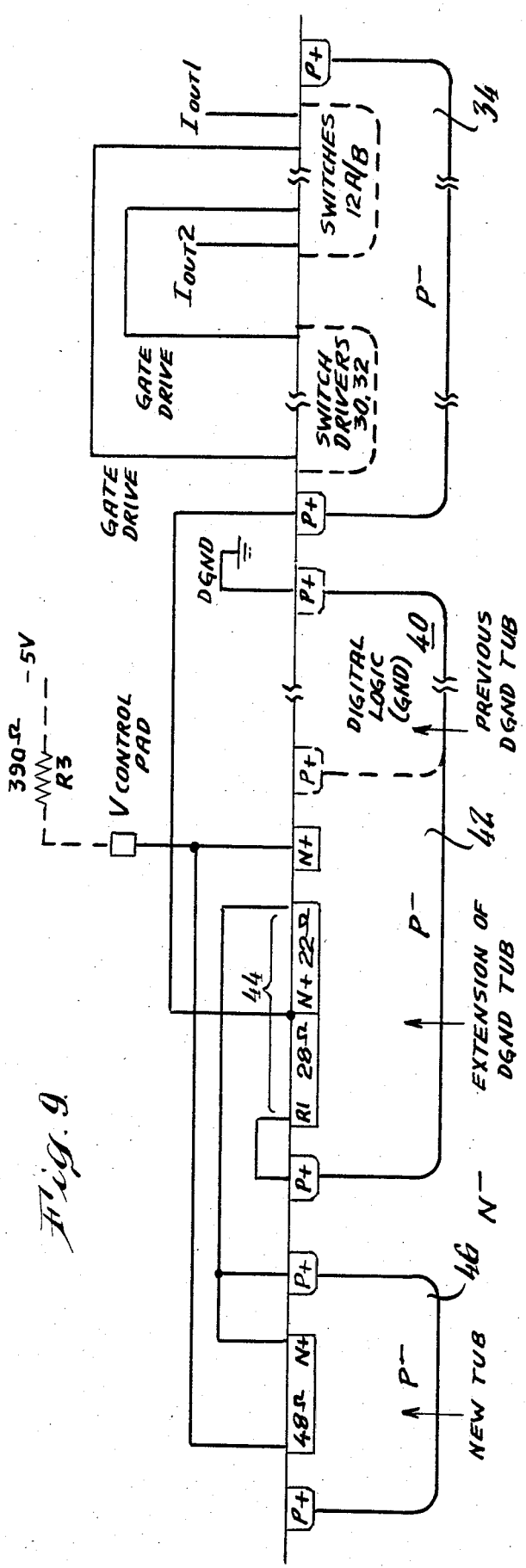
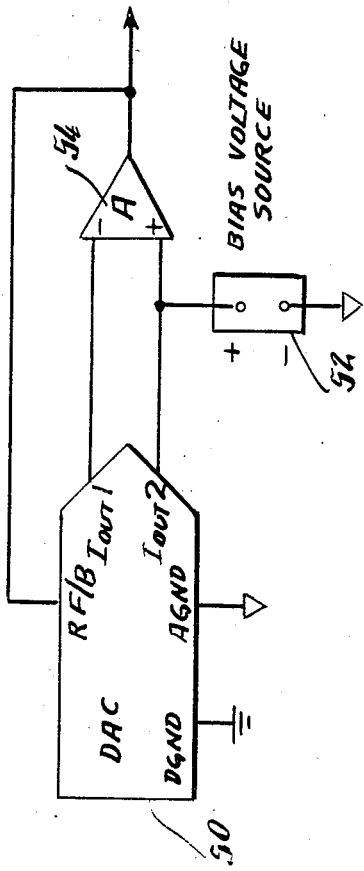
Fig. 9
Fig. 10

LOW LEAKAGE CMOS D/A CONVERTER

This application is a continuation of application Ser. No. 684,453, filed Dec. 21, 1984, now abandoned which is a continuation of application Ser. No. 414,317 originally filed on Sept. 2, 1982, now abandoned.

BACKGROUND OF THE INVENTION

1. Field of the Invention

This invention relates to digital-to-analog converters of the CMOS type. More particularly, this invention relates to minimizing leakage current in such converters.

2. Description of the Prior Art

CMOS D/A converters have been available commercially for quite some time, and provide important advantageous features. Referring now to FIG. 1, conventional converters of the CMOS type include a thin-film R-2R ladder network 10 the shunt resistors of which are connected to N− channel CMOS switch-pairs 12A/B; 14A/B; etc. The individual switches of each pair are complementarily driven so that one switch is off while the other is on, and vice versa. The switches typically have a voltage across them of 10 mV for a 10 V reference voltage and a 10 kΩ–20 kΩ ladder network.

There are three commonly-used configurations of conventional CMOS D/A converters. In order to explain leakage current, each one of these configurations will be examined separately.

Referring first to FIG. 2, the converter shown there comprises three separate lines for $I_{OUT1}$, $I_{OUT2}$ and AGND (analog ground). The ladder termination resistor 16 is tied to AGND. When an all zero's code is applied to the converter, all of the current in the R-2R ladder 10 (except for the one bit of current flowing through the ladder termination resistor to AGND) is steered to the $I_{OUT2}$ terminal. Ideally no current should under these conditions flow to the $I_{OUT1}$ terminal. However, in practice a finite current does flow in the $I_{OUT1}$ terminal and is know as the leakage current.

When an all one's code is applied to the converter of FIG. 2, all of the current in the R-2R ladder (except, again, for the one bit of current through the ladder termination resistor to AGND) is steered to the $I_{OUT1}$ terminal. Any current flowing in the $I_{OUT2}$ terminal is defined as leakage current.

Referring now to FIG. 3, again there are three separate lines for $I_{OUT1}$, $I_{OUT2}$ and AGND. The ladder termination resistor 16 now is tied to $I_{OUT2}$. When an all zero's code is applied to the D/A converter all of the current in the R-2R ladder is steered to the $I_{OUT2}$ terminal, and any current flowing in the $I_{OUT1}$ terminal is defined as leakage current.

When an all one's code is applied to the converter of FIG. 3, all of the current in the R-2R ladder (except for the one bit of current flowing through the ladder termination resistor to $I_{OUT2}$) is steered to the $I_{OUT1}$ terminal. Because of this one bit of current flowing along the $I_{OUT2}$ line, it is not possible to measure leakage current. Hence, leakage current is only defined along the $I_{OUT1}$ line for an input code of all zeros.

Referring now to FIG. 4, there is an $I_{OUT}$ line and an AGND line, where AGND incorporates AGND and $I_{OUT2}$ of FIGS. 2 and 3. The ladder termination resistor 16 is tied to AGND. When an all zero's code is applied to the D/A converter, all the current in the R-2R ladder is steered to the AGND terminal. Any current flowing in the $I_{OUT}$ line is defined as leakage current.

Leakage current, as defined above for the circuit configurations of FIGS. 2 through 4, causes errors in the D/A transfer characteristic, particularly at temperatures greater than 100° C. where the effect is most pronounced. Thus it is desired to reduce such errors.

The leakage current described above actually comprise two separate components which arise for different reasons. To explain this, reference is made to FIG. 5 which shows somewhat schematically the IC structural arrangement of the switches 12A/B for a conventional CMOS DAC. The N− substrate 20 normally is at the most positive supply voltage (5 V to 15 V). The P− well 22 is at zero potential (ground). Leakage current in such a structure comprises the following two components:

(a) Subthreshold leakage current from the R-2R ladder across the "off" switch to $I_{OUT1}$ or $I_{OUT2}$, depending on along which line the leakage current is being measured. This is shown as $I_1$.

(b) Collector-emitter leakage current of the substrate NPN bipolar transistor with grounded base. The transistor is formed by a reverse-biased diode from the N− substrate (collector) to the P− well (base), and a diode from the P− well (base) to the N+ source diffusion (emitter). The N+ source diffusion (emitter) referred to is either to $I_{OUT1}$ or $I_{OUT2}$, depending on along which line the leakage current is being measured. This is shown as $I_2$.

This invention is directed to means and techniques for eliminating or significantly minimizing the leakage currents described above.

SUMMARY OF THE INVENTION

It has been found that if, in the FIG. 5 arrangement, the P− well 22 is biased negative (e.g. to about 200 mV) with respect to the $I_{OUT1}$ and $I_{OUT2}$ terminals, the bipolar transistor leakage currents ($I_2$) flowing into the $I_{OUT}$ lines are virtually eliminated. The subthreshold leakage current ($I_1$) also is simultaneously reduced slightly because the negative bias on the P− well effectively increases the threshold voltage of the N− channel switches.

It further has been found that subthreshold leakage current ($I_1$) is eliminated if the logic low drive to the switches 12A/B is biased negative, e.g. by reducing the "off" gate voltage from 0 V to −200 mV.

BRIEF DESCRIPTION OF THE DRAWINGS

FIG. 5 illustrates schematically the arrangement of CMOS switches in a diffused integrated circuit chip;

FIG. 6 is a circuit diagram illustrating one preferred embodiment of the present invention;

FIG. 7 is a circuit diagram showing one arrangement for developing a bias voltage for the embodiment of FIG. 6;

FIG. 8 is an equivalent circuit corresponding to FIG. 7;

FIG. 9 is a schematic illustration of an integrated circuit implementation of the FIG. 7 bias voltage circuit; and FIG. 10 is a block diagram showing another implementation providing features of the invention.

DESCRIPTION OF PREFERRED EMBODIMENTS

Figure 1:
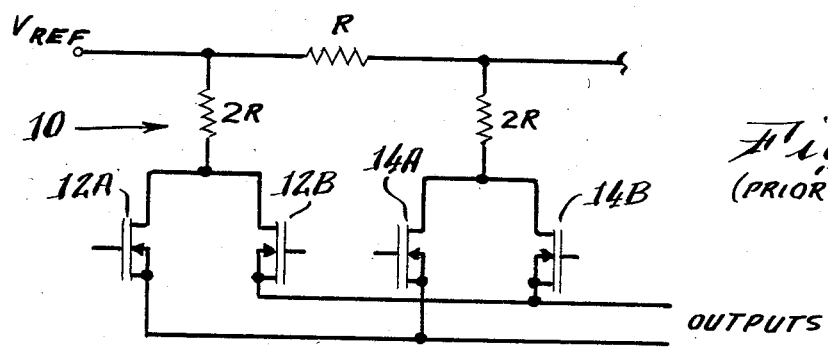
FIGS. 1–4 are circuit diagrams showing conventional CMOS DA circuit configurations.
Figure 2:
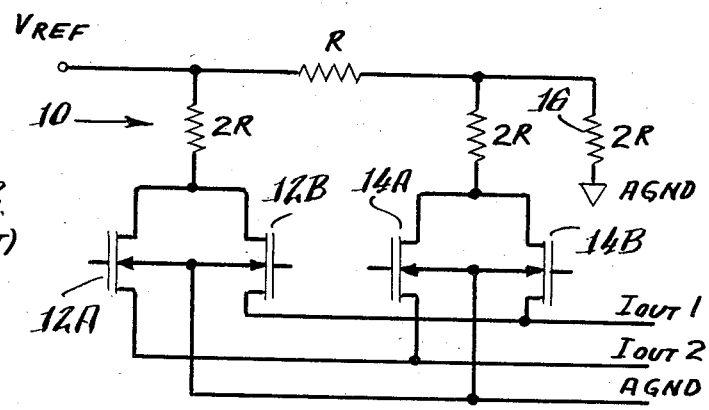
Figure 3:
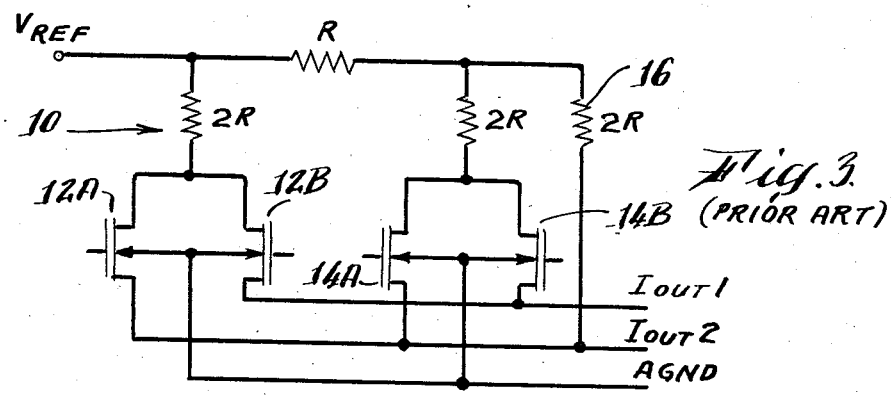
Figure 4:
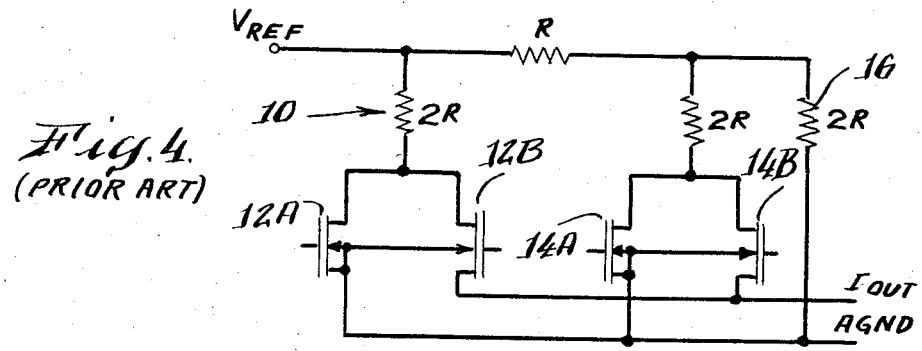

Referring now to FIG. 6, showing one preferred embodiment of the invention, the N— channel switches 12A/B and the switch drivers 30, 32 are placed in a common P— well generally indicated at 34 (e.g. corresponding to P— well 22 in FIG. 5). This common P— well is maintained at a negative potential of −200 mV, as by means of a bias voltage source 36 connected to the well terminal 38, and forming part of the same IC chip.

An exemplary circuit for the bias voltage source 36 is shown in FIG. 7. A negative supply voltage $V_S$ is applied across a resistor $R_3$ in series with a regulating diode $D_1$, producing a regulated voltage $V_D$ of about −700 mV. This voltage is divided by resistors $R_1$ and $R_2$ to provide the −200 mV bias voltage ($V_{TUB}$) for the P— well.

The actual bias voltage selected will represent a compromise between too high a voltage which will increase the N+ source diffusion to P— well leakage and on-switch resistance (producing a gain error), and too low a voltage which will be insufficient both to stop the leakage current crossing the N+−P— boundary and to turn off the subthreshold leakage current from source to drain. Presant indications are that the lower limit of the bias voltage is about −150 mV. The upper limit is not so definite, but preferably is in the range of about −300 mV to −500 mV.

The value of resistors $R_1$ and $R_2$ should be selected so as to avoid any problems caused by transient currents ($I_{TRANS}$) through the switch drivers. To illustrate the relationships involved, the following somewhat simplified analysis is presented:

When $I_{TRANS} = 0$, $\dfrac{R_1}{R_1 + R_2} = \dfrac{V_{TUB}}{V_D} \rightarrow$ $$\dfrac{1}{1 + R_2/R_1} = \dfrac{V_{TUB}}{V_D} \rightarrow$$

$$\dfrac{R_2}{R_1} = \dfrac{V_D}{V_{TUB}} - 1$$

$V_D = 0.7V \; V_{TUB} = 0.2V \rightarrow R_2 = 2.5R_1$
Let $R_1 = R_X \rightarrow R_2 = 2.5R_X$ The equivalent circuit seen looking from the P— well into the FIG. 7 circuit is shown in FIG. 8. In order that the tub potential not rise above 0 V at the time of switching, the voltage drop across the equivalent internal resistor $0.714 R_X$ must be less than, or equal to, 0.2 V.

i.e. $I_{TRANS} \times 0.714 R_X \leq 0.2V. \rightarrow R_X \leq \dfrac{0.2V}{I_{TRANS} \times 0.714}$ Assuming that the transient current is 10 mA -

$$\therefore R_X \leq \dfrac{0.2}{0.714 \times 10^{-2}} \rightarrow R_X \leq 28\Omega$$

$$\therefore R_1 = 28\Omega \; R_2 = 70\Omega$$

The value of $R_3$ is chosen to assure that there is always a forward biasing current through the diode $D_1$.

A more analytical approach to calculating component values would take into account variation of diode voltage with temperature, plus resistor variations with temperature (whether thin-filmed or diffused).

FIG. 9 shows a suggested integrated circuit implementation of the circuit of FIG. 7. The P— well 40 which normally contains the digital logic (not the Well for the switch drivers 30, 32 and switches 12A/B) is enlarged to provide a ground tub extension 42 to allow room for the P−−N+ diode $D_1$ plus a diffused N+ resistor 44. The series combination of $R_1$ and $R_2$, 98 $\Omega$ in all, is divided in two, with 50 $\Omega$ in the digital ground tub 42, and 48 $\Omega$ in a separate P— well 46. The reason for splitting the resistors between separate tubs is to avoid any more than 0.35 V forward bias across P−−N+ junctions, thereby ensuring all parasitic diodes are turned off.

As the circuit is shown, $R_3$ is external to the package. It could also be included on-chip in the form of a thin-film resistor, its value depending on the voltage to be put on the $V_{CONTROL}$ pin.

It will be noted that in the FIGS. 6 and 9 embodiment, both forms of leakage ($I_1$ and $I_2$) are eliminated simultaneously, but the effect of transient currents in the switch drivers must be taken into account. To avoid such transient current effect, the N— channel switches 12A/B, etc., may alternatively have their thresholds increased by ion-implantation, with only the back-gates of the switches being biased negative (as by −200 mV). The P— well containing the N— channel switches would in such a modified arrangement be separated from that containing the switch drivers 30, 32 which can be placed in the grounded P— well 42 used by the digital logic. The bipolar transistor leakage current is as before eliminated by the −200 mV bias of the back gates. The subthreshold leakage current is eliminated by the ion-implanting of the N— channel switches.

The circuit of FIG. 7 can be used for generating the −200 mV bias for the P— well containing the N— channel switches. In this case, the equivalent resistance seen looking from the P— well is not critical since there will be no current flowing from the well. The biasing circuit can easily be integrated onto the D/A converter. Resistors $R_1$, $R_2$ and $R_3$ could be thin-film and, as before, an external control voltage is required to bias this circuit into operation.

Still another embodiment of the invention is shown in FIG. 10. This arrangement includes a conventional CMOS DAC 50 with its $I_{OUT1}$ and $I_{OUT2}$ both offset in a positive direction with respect to DGND and AGND (zero volts). Illustratively, such offset is produced by connecting a positive bias voltage source 52 (e.g. 200 mV) to the positive terminal of the output op-amp 54. The output of the op amp is connected to the feedback resistor $R_{F/B}$ terminal which, in conventional DAC configurations, leads to an on-board feedback resistor in the DAC structure (as in FIG. 6).

The FIG. 10 configuration eliminates bipolar transistor leakage current, and somewhat reduces subthreshold leakage current as a result of the effective increase in N— channel threshold voltage. The ladder termination resistor (not shown in FIG. 10) must be connected to $I_{OUT2}$. Connecting the ladder termination resistor to AGND would cause D/A converter non-linearity.

Although several preferred embodiments of the invention have been disclosed herein in detail, it is to be understood that this is for the purpose of illustrating the invention and should not be construed as necessarily limiting the scope of the invention, since it is apparent that many changes can be made by those skilled in the art while still practicing the invention claimed herein.

We claim:

1. In a CMOS digital-to-analog converter comprising at least one switch-pair in a common well, the individual switches of such pair being complementarily driven to "on" and "off" condition respectively to switch a corresponding resistance network terminal to one or the other of a pair of output lines in accordance with the state of an input bit, each switch having a driving gate and a back gate;

that improvement in such a converter for reducing leakage current comprising:

bias means to develop a predetermined potential difference between said output lines and said well with said well being more negative than said output lines, thereby to avoid bipolar leakage current.

2. A converter as claimed in claim 1, wherein said bias means is operable to bias said well negative with respect to ground, thereby to bias the switch back gates correspondingly.

3. A converter as claimed in claim 2, including means to drive the off gate voltage negative with respect to said output lines.

4. A converter as claimed in claim 3, where the off gate voltage is in the range of about 150 mV to 500 mV negative with respect to said output lines.

5. A converter as claimed in claim 4, where said off gate voltage is about 200 mV negative with respect to said output lines.

6. A converter as claimed in claim 2, wherein said negatively-biased well includes the switch drivers for said switches.

7. A converter as cliamed in claim 6, including a second well forming a diode for developing the bias voltage.

8. A converter as claimed in claim 7, including either diffused resistors on said second well or thin-film resistors for scaling down the diode voltage to the proper level.

9. A converter as claimed in claim 2, wherein said switches are ion-implanted to avoid subthreshold leakage current.

10. A converter as claimed in claim 1, including output op amp means connected to said output lines respectively; and a positive bias voltage source connected to said op-amp means to produce said potential difference.

11. A converter as claimed in claim 10, wherein said op-amp means comprises an op amp with its input terminals connected to said output lines respectively;

a negative feedback resistor connected between the op-amp output and its negative input terminal;

said positive bias voltage source being connected to the positive input of said op amp.

12. A converter as claimed in claim 11, wherein the bias voltage is in the range of about 150 mV to 500 mV.

13. A converter as claimed in claim 1, wherein said potential difference is in the range of about 150 mV to 500 mV.

14. A converter as claimed in claim 13, wherein said potential difference is about 200 mV.

15. A converter as claimed in claim 1, wherein said common well is P-type in an N-type substrate;

said output lines being connected to an N-type region within said common well.

* * * * *